United States Patent [19]
Lindqvist

[11] Patent Number: 5,937,180
[45] Date of Patent: Aug. 10, 1999

[54] METHOD AND APPARATUS RELATING TO A TELECOMMUNICATIONS SYSTEM

[75] Inventor: Dan Lindqvist, Sollentuna, Sweden

[73] Assignee: Telefonaktiebolaget LM Ericsson, Stockholm, Sweden

[21] Appl. No.: 08/770,902

[22] Filed: Dec. 20, 1996

[30] Foreign Application Priority Data

Dec. 21, 1995 [SE] Sweden .................................. 9504583

[51] Int. Cl.⁶ .............................. H03K 17/00; G06F 9/44
[52] U.S. Cl. .......................................................... 395/500
[58] Field of Search ................... 395/500; 364/488–491; 379/157; 370/271, 435, 385, 363; 375/216

[56] References Cited

U.S. PATENT DOCUMENTS

| | | |
|---|---|---|
| 4,850,011 | 7/1989 | Delmerge et al. ...................... 379/157 |
| 4,902,917 | 2/1990 | Simpson . | |
| 5,101,498 | 3/1992 | Ehlig et al. . | |
| 5,438,672 | 8/1995 | Dey . | |
| 5,598,401 | 1/1997 | Blackwell et al. ...................... 370/385 |
| 5,600,649 | 2/1997 | Sharma et al. ........................... 370/435 |
| 5,619,496 | 4/1997 | Weir ........................................ 370/363 |
| 5,764,628 | 6/1998 | Davis et al. ............................. 370/271 |
| 5,778,024 | 7/1998 | McDonough ........................... 375/216 |

*Primary Examiner*—Kevin J. Teska
*Assistant Examiner*—Dan Fiul
*Attorney, Agent, or Firm*—Burns, Doane, Swecker & Mathis, L.L.P.

[57] ABSTRACT

An integrated circuit which can function in a number of different operating modes is set to a setting mode by a control signal on the control signal input. The circuit includes a signal sequence generator which in the setting mode generates setting signal sequences on four of the address connections of the circuit. An operating mode is selected by coupling one of the address connections with a setting signal input on a signal sequence detector in the circuit. The signal sequence detector interprets the setting signal sequence from the signal sequence generator and sets control outputs, on the signal sequence detector to different combinations of "low" and "high" signal levels respectively in dependence on the sequence received in the detector, whereafter the circuit switches to an operating mode in which the address conductors forward signals in accordance with the operating mode.

20 Claims, 6 Drawing Sheets

| MODE | CONNECTION | SM1 | PO1 | PO2 | SO1 | SO2 |
|------|------------|-----|-----|-----|-----|-----|
| 1 | M - A0 | 001 | 1 | 0 | 1 | 1 |
| 2 | M - A1 | 010 | 1 | 0 | 0 | 1 |
| 3 | M - A2 | 100 | 0 | 1 | 1 | 1 |
| 4 | M - A3 | 101 | 0 | 1 | 0 | 1 |

| MODE | CONNECTION | SM1 | SM2 | PO1 | PO2 | SO1 | SO2 |
|---|---|---|---|---|---|---|---|
| 1 | M1 - A0  M2 - GND | 001 | 000 | 1 | 0 | 1 | 1 |
| 2 | M1 - A1  M2 - GND | 010 | 000 | 1 | 0 | 0 | 1 |
| 3 | M1 - A2  M2 - GND | 100 | 000 | 0 | 1 | 1 | 1 |
| 4 | M1 - A3  M2 - GND | 101 | 000 | 0 | 1 | 0 | 1 |
| 5 | M1 - A0  M2 - Vcc | 001 | 111 | 0 | 0 | 1 | 1 |
| 6 | M1 - A1  M2 - Vcc | 010 | 111 | 0 | 0 | 0 | 1 |
| 7 | M1 - A2  M2 - Vcc | 100 | 111 | 1 | 1 | 1 | 1 |
| 8 | M1 - A3  M2 - Vcc | 101 | 111 | 1 | 1 | 0 | 1 |

METHOD AND APPARATUS RELATING TO A TELECOMMUNICATIONS SYSTEM

BACKGROUND

The present invention relates to methods and apparatus for setting the operating mode of an integrated circuit which performs different functions in accordance with the operating mode selected.

Integrated circuits that are able to perform different functions are becoming more and more usual. Equipment in which an integrated circuit shall be included is often required to be compact and effective with respect to current consumption. Such requirements can be met by incorporating parts of the equipment in the integrated circuit. The more functions that are built into the integrated circuits, the larger the circuits. Furthermore, it is often beneficial to use one and the same circuit in different applications in which the circuit performs different working functions. In order for the circuit to operate, it is necessary to be able to set the circuit to different operating modes.

Earlier solutions to setting such circuits in respective operating modes have involved dedicating a number of circuit-mounted setting signal inputs to solely control setting of the circuit. A signal level is applied to these inputs, by applying to the inputs either a low or a high signal level, for instance signal earth or an operational voltage respectively, e.g. with the aid of a switch. The applied signal level is read into the circuit at a predetermined time point, normally when starting-up, and is there interpreted as an operating mode.

In a development of the aforedescribed method resulting in the ability to use the signal connections in normal operations subsequent to said connection having served as setting signal inputs, the signal connections are coupled to the earlier mentioned signal levels through the medium of resistors. This enables the signal connections to be used also in the normal operation that follows termination of the setting process without risking short circuiting.

The problem with these solutions is that it is necessary to dedicate a plurality of signal connections, and therewith a number of connecor pins, solely to the setting functions. The space available for accommodating electronics in modern equipment can be very limited, meaning that the larger the number of connector pins required by a circuit the more difficult it becomes to meet the requirement of compact equipment.

With regard to resistor-loaded setting signal inputs, a further problem resides in the fact that when the circuit transmits or receives signals on said signal pins upon completion of a mode setting process, current will flow through the resistors with increased power consumption as a result. This results, for instance, in the inability to meet the requirement of equipment compactness, particularly in those cases when the equipment is powered by a space-consuming battery.

U.S. Pat. No. 4,902,917 teaches a way of at least partially avoiding these problems. In this case, an integrated circuit is set to its operating mode by sending one of at least two different setting signals to a setting signal input. The different setting signals are obtained from clock signal outputs on the integrated circuit. The clock signal to be sent to the setting signal input is chosen, for instance, by output selection with the aid of a multipath switch.

One drawback with this solution is that the signal outputs which forward the clock-signal cannot be used with anything other than just clock signals after the the operating mode has been set.

SUMMARY

The problem associated with known solutions is that an operating mode is set with the aid of signal outputs which send to a setting signal input signal sequences which are not changed subsequent to having set the operating mode. Thus, one is dependent on the normal function of the signal outputs when setting a circuit to an operating mode.

The problem is solved in accordance with an inventive method, by selecting one of the circuit signal connections and coupling this connection with the setting signal input. The circuit then continues in a setting mode in which normal operation of the circuit ceases and predetermined signal sequences are sent on the selected signal connections. Upon receipt of the signal sequences on the setting signal input, the signal sequences are interpreted as a request to set the circuit to an operating mode. The signal connections then return to normal operation, either as outputs' or inputs.

Apparatus constructed in accordance with the invention includes an integrated circuit which can work in at least two mutually different operating modes. The circuit includes at least one setting signal input and at least two further signal connections. The signal connections may be of any chosen kind: input, output or an input-output combination. One of these signal connections is connected to a setting signal input with a connection through which setting signals are transmitted.

The inventive method comprises selecting an operating mode whereafter the setting signal input is connected to one of the signal connections, said signal connection representing the selected operating mode. The circuit is then switched to a setting mode in which each of a plurality of signal connections transmits a predetermined setting signal sequence that is unique for each of the selectable operating modes.

When receipt of the setting signal sequence on the setting signal input has terminated, the circuit is switched from the setting mode to the selected operating mode, in which operating mode the signal connections switch to normal operation with output signals and/or input signals in accordance with the selected operating mode.

One object of the invention is hereby achieved, viz the ability of setting a circuit to an operating mode with the least possible number of dedicated connections and without unnecessary current consumption.

One advantage afforded by the invention is that a plurality of the signal connections of the circuit are used for only a short period of time, in the circuit setting mode. Upon completion of the circuit setting procedure, these connections return to their normal operating mode as signal outputs or signal inputs, thereby enabling the number of signal connections on the circuit to be minimized.

The invention will now be described in more detail with reference to preferred exemplifying embodiments thereof and also with reference to the accompanying drawings.

DETAILED DESCRIPTION OF PREFERRED EMBODIMENTS

Figure 1A:
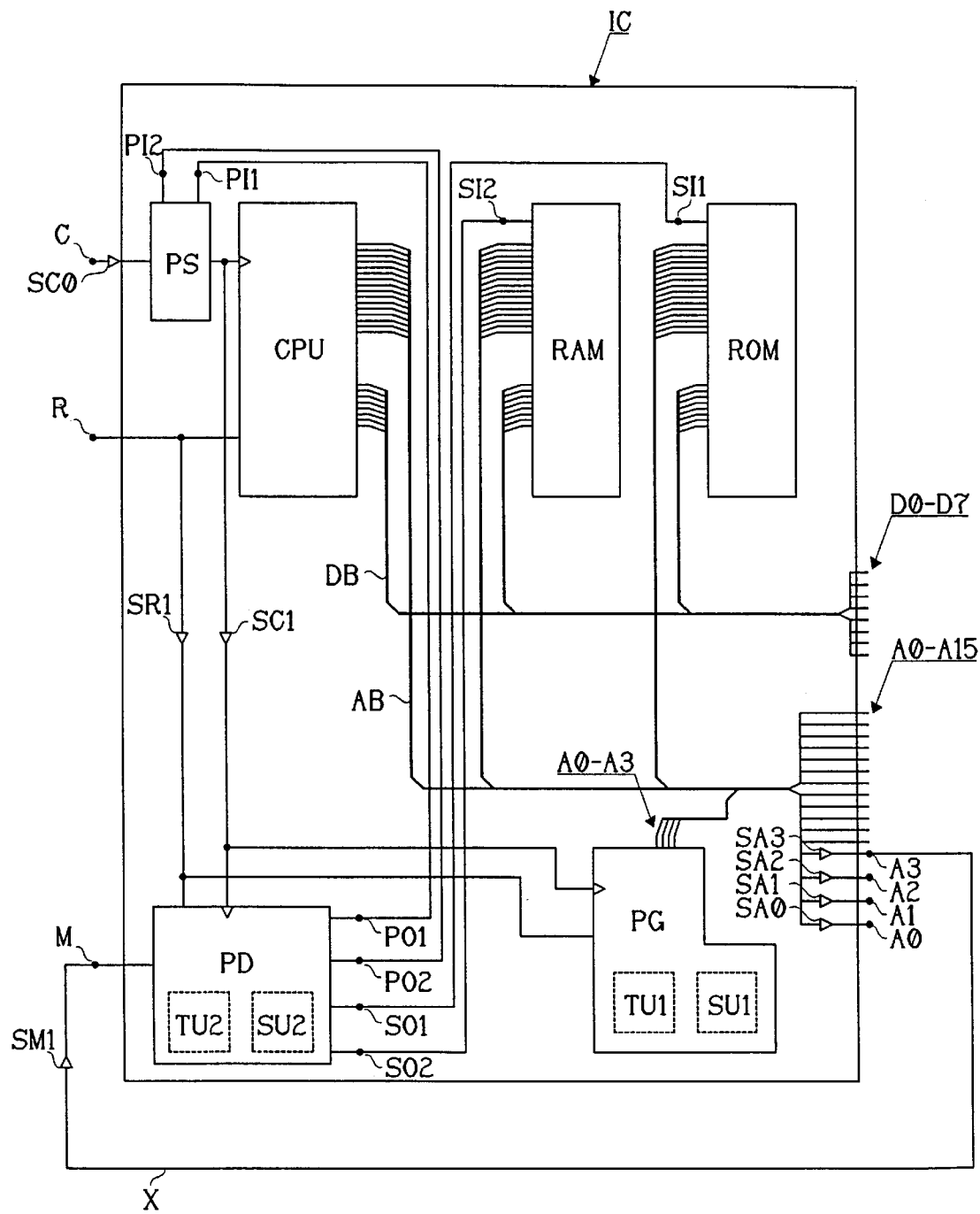
FIG. 1a is a block diagram of an integrated circuit which can be adjusted to different operating modes, in accordance with a first embodiment of the invention.

FIG. 1a illustrates an integrated circuit IC forming part, for instance, of a control circuit included in a larger system not shown in the Figure. The circuit will normally be mounted on a circuit board together with other integrated circuits. The different connections and components of the circuit IC will be described in more detail below.

The circuit IC includes a computer unit CPU, a read-write memory RAM, a read-only memory ROM, a signal sequence detector PD, a signal sequence generator PG, a scaling unit PS and connections between these components.

The computing unit CPU makes computations and controls the transport of information to and from other circuit components or units. The read-only memory ROM contains information which can be read by the computing unit CPU but not overwritten.

The write and read memory RAM contains information that can be both read and overwritten by the computing unit CPU. The memory units RAM, ROM both have respective control inputs SI1 and SI2 which function to receive control signals in the form of two different signal levels, "low" and "high" levels, from the signal sequence detector PD. A "high" signal level on the control input SI1 of the read-only memory ROM enables data to be read therefrom through a data bus DB. Correspondingly, a "high" signal level on the control input SI2 of the readwrite memory RAM enables data to be read from and written into the RAM-memory through the data bus DB.

Information is transported between the memory units RAM, ROM and the computing unit CPU via the data bus DB which consists of eight data conductors D0–D7. An address bus AB having sixteen address conductors A0–A15 transfers binary addresses from the computing unit CPU to the memory units RAM, ROM for enabling information to be read from and written into memory positions in the memory units ROM, RAM via the data bus DB.

The scaling unit PS is connected to the computing unit CPU, the signal sequence generator PG and the signal sequence detector PD, and functions to transfer or deliver a clock signal SC1 to these units. The clock signal SC1 is necessary for synchronizing all circuit functions and may have different frequencies which are determined by the information received on the first control input PI1 of the scaling unit PS and on its second control input PI2 from the signal sequence detector PD. In a manner similar to that of the memory circuits ROM, RAM, the control inputs PI1, PI2 detect whether the two different signal levels are "high" or "low" respectively. If the control input PI1 receives a "high" signal level and the control input PI2 receives a "low" signal level, the scaling unit PS delivers the clock signal SC1 with a first frequency f1. On the other hand, if the signal on the control input PI1 has a "low" signal level and the level of the signal on the control input PI2 is "high", the scaling unit PS delivers the clock signal SC1 with a second frequency f2. The clock signal SC1 is generated in the scaling unit PS from a clock signal SC0 transmitted to the circuit IC on a clock signal input C.

The signal sequence generator PG is connected to four address conductors or lines A0–A3 on the address bus AB, the so-called first four address conductors A0–A3. These address conductors have the function of sending predetermined signal. sequences SA0–SA3 on respective address conductors A0–A3. This occurs when the circuit IC is in a setting mode initiated by a control signal SR1, this mode being described in more detail below. The predetermined signal sequences are sent over a limited time period DT, shown in FIG. 1c, and are controlled with the aid of information stored in a first time monitoring unit TU1. The signal sequences SA0–SA3 are stored in a first storage unit SU1 in the signal sequence generator PG.

The signal sequence detector PD functions to receive a control signal sequence SM1 from the signal sequence generator PG via a connection X during the time that the circuit IC is in the circuit setting mode and to interpret this signal sequence. The connection X will be explained in more detail further on in the description with reference to the inventive method. The signal sequence detector PD sends control signals to other units in the circuit in accordance with this interpretation, through the medium of four control signal outputs P01, P02, S01, S02. The first control signal output P01 and the second control signal output P02 are connected respectively to the first control input PI1 and the second control input PI2 of the scaling unit. Respective third and fourth control signal outputs S01 and S02 are connected respectively to the control input SI1 of the read-only memory ROM and to the control input SI2 of the read-write memory RAM.

A clock signal input C is connected to the scaling unit PS which forms the internal clock signal SC1 from the incoming external clock signal SC0. The internal clock signal SC1 is passed from the scaling unit PS to the other units in the circuit IC. A control signal input R is connected to the computing unit CPU, the signal sequence generator PG and the signal sequence detector PD. A control signal SR1 which places the circuit IC in the earlier mentioned setting mode is sent to these units via the control signal input R. A setting signal input M is connected to the signal sequence detector PD and a signal sequence SM1 is sent to the input M from the signal sequence generator PG. The address conductors A0–A15 of the address bus AB also include circuit mounted connections. Binary addresses are sent on the address conductors A0–A15 partly to the integrated circuit units and partly to external units. A special function is performed by the earlier mentioned first four address conductors A0–A3: In addition to being connected to the computing unit CPU and the memory units RAM, ROM, similar to remaining address conductors A4–A15, the first four address conductors are also connected to the signal sequence generator PG, as earlier mentioned. In the setting mode, the signal sequence generator PG sends the setting signal sequences SA-SA3 to the signal sequence detector PD on these first four address conductors A0–A3. The signal sequence that is received in the signal sequence detector PD will depend on which of the address conductors A0–A3 is connected to the circuit setting signal input M.

The data bus DB and its data conductors D0–D7 also include external connections on the circuit IC. Information is passed between the circuit unit and between circuit external units (not shown in the Figure) through these connections D0–D7.

Figures 1B, 1C:
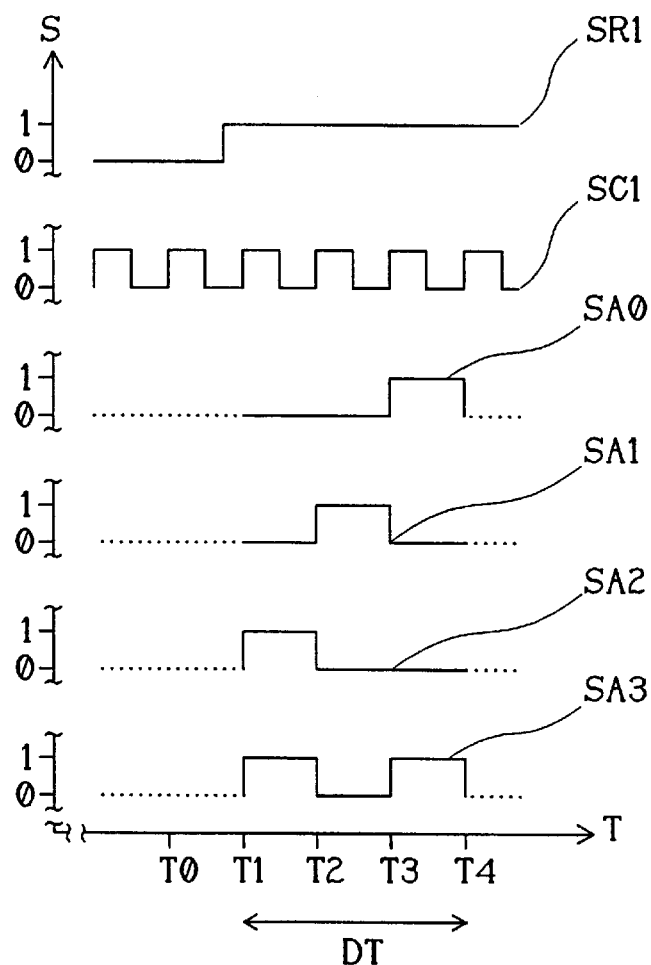
FIG. 1b is a table illustrating different circuit connections.
FIG. 1c is a diagram illustrating signal sequences to and from the circuit connections.

FIG. 1b illustrates the manner in which different circuit operating modes are initiated. For instance, the first operating mode is initiated when the signal sequence detector PD adapts its control outputs P01, P02, S01, S02 to the binary levels 1011, or when expressed in the earlier mentioned signal levels, to "high" "low" "high" "high". The circuit IC can operate in one of four different modes. In the first operating mode, the clock signal SC1 has the first frequency f1 and the computing unit CPU is able to communicate with both memory units ROM, RAM through the data bus DB and the address bus AB. In the second operating mode, the clock signal SC1 has the same first frequency f1 but the read-write memory RAM is disconnected from the data bus DB and the address bus AB, meaning that the only memory unit with which the computing unit CPU communicates is the read-only memory ROM. The third operating mode is defined by the clock signal SC1 having the second frequency f2 and by the computing unit CPU being able to communicate with both memory units ROM, RAM as in the first operating mode. In the fourth operating mode, the clock signal SC1 has the second frequency f2 and the read-write memory RAM is disconnected from the data bus DB and the address bus AB as in the second operating mode.

Each of these operating modes is corresponded by a unique setting signal sequence SA0–SA3 stored in the first storage unit SU1 in the signal sequence generator PG. When the control signal SR1 is received on the control signal input R, the circuit IC is placed in a setting mode and the signal sequence generator PG sends the signal sequences SA0–SA3 on respective address conductors A0–A3. These setting signals SA0–SA3 are received in the signal sequence detector PD which, on the basis of which of the sequences SA0–SA3 has been received, indicates which of the control outputs S01, S02, P01, P02 shall be set to the signal level 0 and which of the control outputs S01, S02, P01, P02 shall be set to the signal level 1. The circuit IC is considered to be set to an operating mode when the control input SI1, SI2 on the memory unit ROM, RAM and the control inputs PI1, PI2 on the scaling unit PS have detected these signal levels.

An inventive method will now be described with reference to FIGS. 1a–c with the fourth operating mode being used by way of illustration.

Figure 1D:
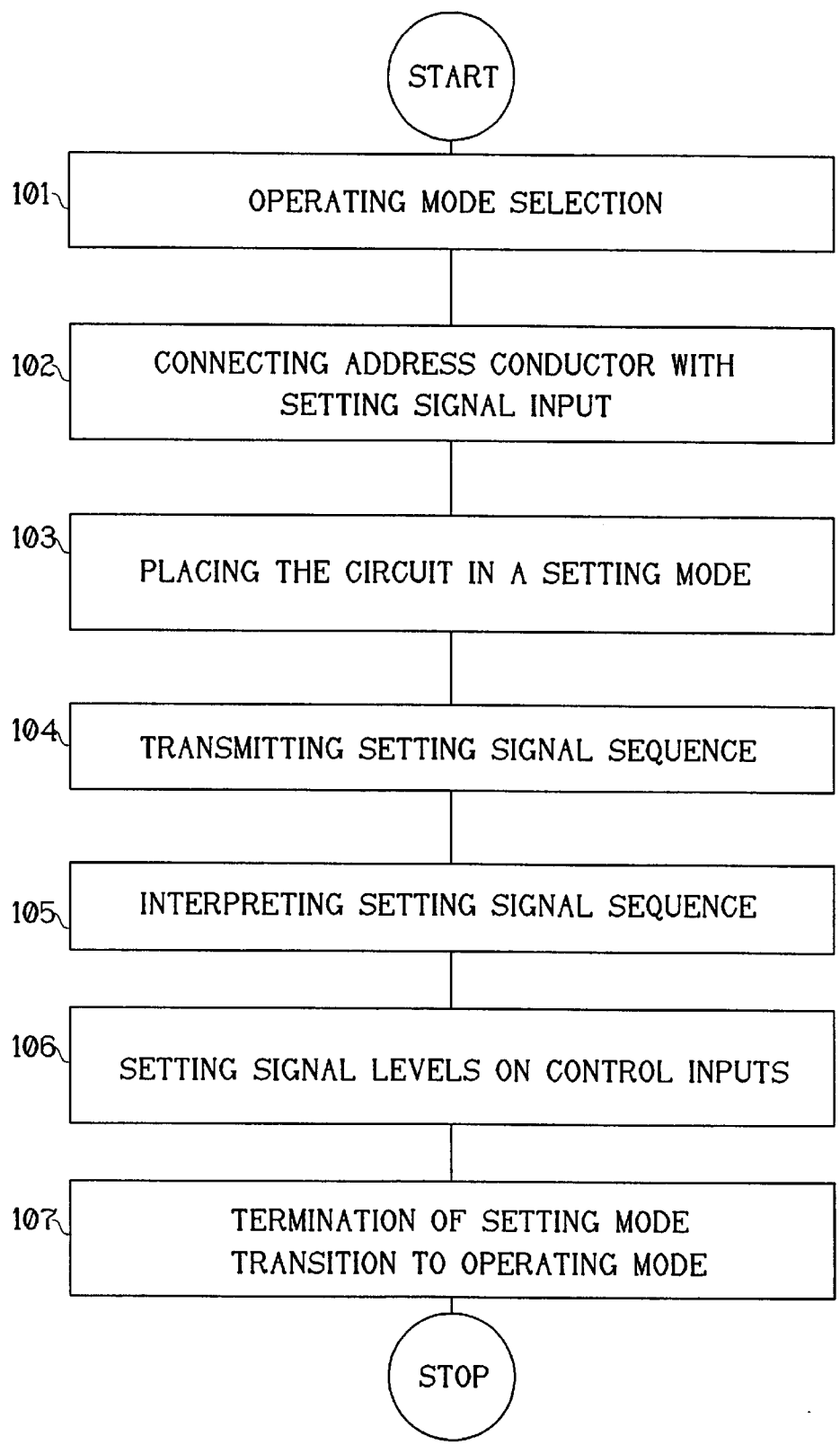
FIG. 1d is a flowchart illustrating an inventive method.

The clock signal SC1 is shown in the diagram of FIG. 1c together with the control signal SR1. A clock cycle is the time that passes between two time markings, e.g. from T2 to T3. The signal level S shown on the ordinate in the diagram corresponds to levels 0 and 1. The broken line parts of these signals, prior to time point T1 and subsequent to time point T4, indicate that the address bus connections A0–A2 then send arbitrary signals. The circuit IC is thus in a normal operating mode prior to time T1 and subsequent to time T4. The aforesaid time interval, designated DT in FIGS. 1c and 1d, is thus the interval in which the circuit IC is in a setting mode.

The inventive method comprises the following method steps:

A user elects to place the circuit IC in the fourth operating mode of the aforedescribed four operating modes.

A connection X is made between the setting signal input M and the address bus connection A3. The connection may have the form of a strap on the circuit board (not shown in the Figure) on which the circuit IC is mounted, between said connections A3, M.

The circuit IC is brought to the setting mode by sending a control signal SR1 to the circuit IC via the control signal input R. The control signal SR switches the level S from 0 to 1 at a time point between T0 and T1 in accordance with FIG. 1c. This change in signal level is detected in the circuit IC and the normal operating mode of the circuit IC is interrupted when the clock cycle T1–T2 begins and the circuit IC is brought to a setting mode.

The signal sequences SA0–SA3 are sent from the signal sequence generator PG on the address bus connections A0–A3. The signal sequences are transmitted during the time interval DT, the clock cycles T1–T2, T2–T3 and T3–T4 illustrated in FIG. 1c. Because the connection X has been made between the address conductor A3 and the setting signal input M, the setting signal sequence SM1 that reaches the setting signal input M will be the signal sequence that was sent from the address conductor A3 as signal sequence SA3. The time DT over which the setting mode prevails is controlled by a first time monitoring unit TU1 in the signal sequence generator PG. This first time monitoring unit TU1 interrupts transmission of the signal sequences SA0–SA3 from the signal sequence generator PG upon reaching a time deadline stored in the first time monitoring unit TU1, this deadline being expressed in a number of clock cycles of the clock signal SC1.

The signal sequence detector PD receives the signal sequence SM1 sent from the signal sequence generator PG via the selected address conductor A3 and the connection X to the setting signal input M. The received signal sequence SM1 is stored in the second storage unit SU2. The signal sequence SM1, which is available in the second storage unit SU2 subsequent to the setting mode, determines into which operating mode the circuit IC shall be placed on the basis of the interpretation described herebelow.

The setting signal sequence SM1 is interpreted in the signal sequence detector PD and the control outputs P01, P02, S01, S02 are placed at the binary levels 0101 ("low" "high" "low" "high") in accordance with the table in FIG. 1b. The control input SI1 of the read-only memory ROM will thus be set to the level "high" and results in said memory being connected to the address bus AB and the data bus DB. The control input SI2 of the read-write memory RAM is set to level "low" and results in said memory RAM being disconnected from the busses AB, DB. The scaling unit PS receives the signal levels "low" and "high" on respective signal inputs PI1 and PI2. This results in the scaling unit PS transmitting the clock signal SCI with the second frequency f2. Reception of the setting signal SM1 in the signal sequence detector PD is interrupted when the time deadline stored in the second time monitoring unit TU2 has been reached, this time deadline being expressed in a number of clock cycles of the clock signal SC1. This time deadline has the same duration as the time deadline stored in the first time monitoring unit TU1.

Termination of the operating mode setting. Setting of the operating mode is terminated when having received the setting signal SM1 in the circuit IC through the setting signal input M after the clock cycle T3–T4. This is carried out in response to commands from the time monitoring units TU1 and TU2. The circuit IC therewith switches from the setting mode to the fourth operating mode in which all circuit units operate in accordance with this particular working mode and the address conductors A0–A3 revert to sending binary addresses.

FIG. 1d illustrates the method steps that are most essential to the invention. The flow diagram is intended to be read together with the following description:

In a first step 101, a user elects to place the circuit IC in the fourth operating mode.

In a second step 102, the address conductor A3 is connected to the setting signal input M.

In a third step 103, the circuit IC is placed in the setting mode, by sending a control signal SR1 to the control signal input R of the circuit IC.

In a fourth step 104, the setting signal sequence SA3 is sent from the signal sequence generator PG to the signal sequence detector PD, via the setting signal input M.

In a fifth step 105, the setting signal sequence SM1 received in the signal sequence detector PD is interpreted.

In a sixth step 106, the control outputs S01, S02, P01, P02 of the signal sequence detector PD are set to the signal levels "low" "high" "low" and "high" respectively, these signal levels therewith also being delivered to the control inputs SI1, SI2 of the memory units RAM, ROM and the control inputs PI1, PI2 of the scaling unit PS.

In a seventh step 107, the procedure is terminated by virtue of the circuit IC switching to the selected operating mode, in which mode the address conductors A0–A3 are used in accordance with the operating mode.

It was said in the aforegoing that the selected address conductor A3 is connected to the setting signal input M directly with the connection X. However, it is conceivable that this connection can be achieved in other ways, for instance with the aid of a multipath switch which is able to bring the different address conductors A0–A3 into contact with the setting signal input M in response to a simple switch-over.

FIGS. 2a, 2b, 2c and 2d illustrate an alternative embodiment of an integrated circuit IC2 in accordance with the invention. Similar to the circuit IC in the former example, the circuit IC2 includes a computing unit CPU, a read-write memory RAM, a read-only memory ROM, a signal sequence detector PD2, a signal sequence generator PG, a scaling unit PS and connections therebetween. The circuit IC2 thus includes all the units and connections included in the circuit IC in FIG. 1a, but with addition that the circuit IC2 has two setting signal inputs M1, M2. Similar to what has been described above, these signal inputs M1, M2 are both connected to the signal sequence detector PD2 with its four control outputs P01, P02, S01, S02. The signal sequence detector PD2 functions to receive the signal sequences SM1, SM2 from the signal sequence generator PG via the connections X1, X2, said sequences being stored in the storage unit SU2 and interpreted. The signal sequence SM1 received on the signal input M1 controls those signal levels applied to the control outputs P01, P02 connected to the scaling unit PS. The signal sequence SM2 that has been received on the signal input M2 controls those signal levels applied to the control outputs S01, S02 connected respectively to the read-only memory ROM and the read-write memory RAM.

Figure 2A:
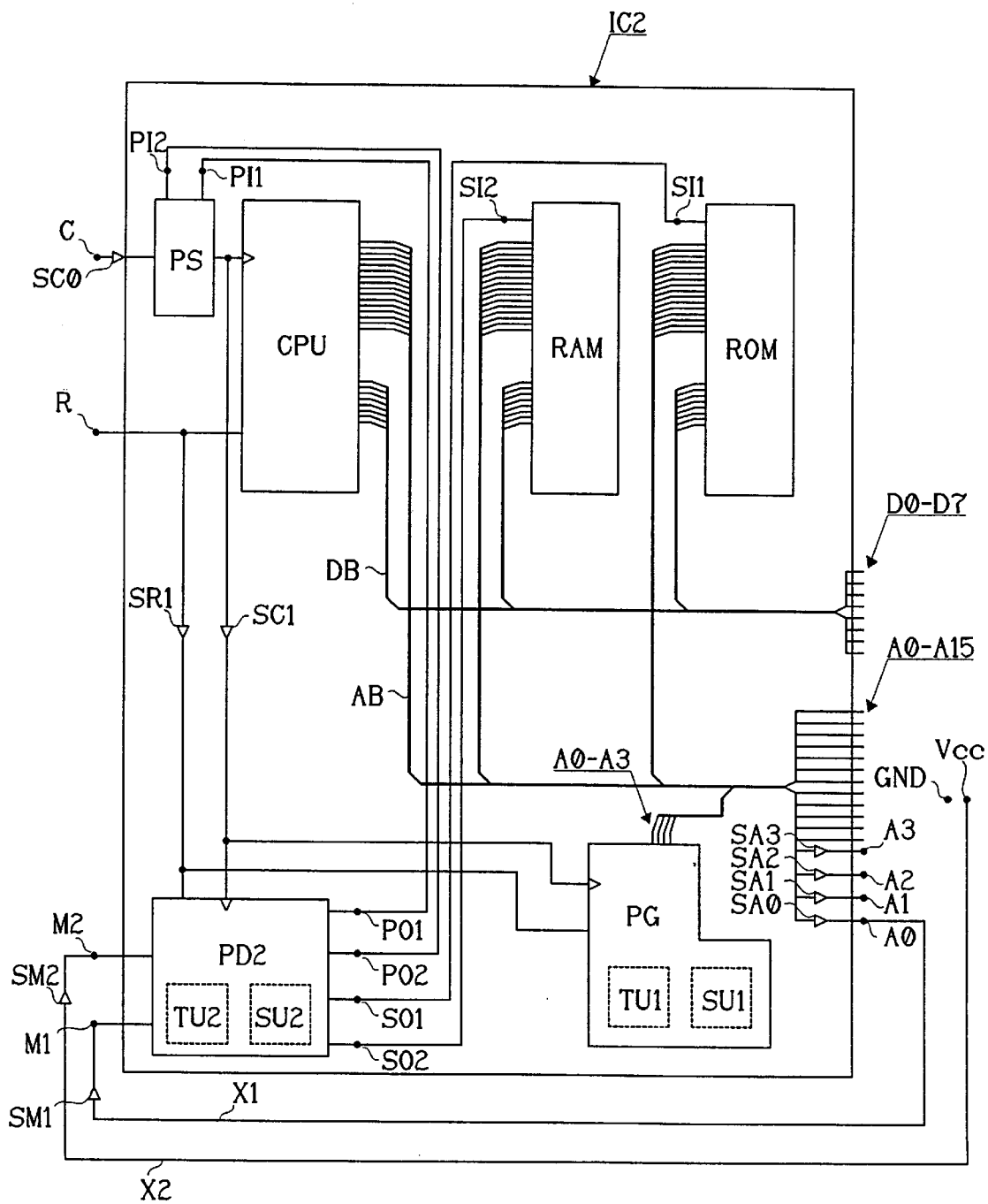
FIG. 2a is a block diagram illustrating an integrated circuit that can be adjusted to different operating modes in accordance with a second embodiment of the invention.
Figures 2B, 2C:
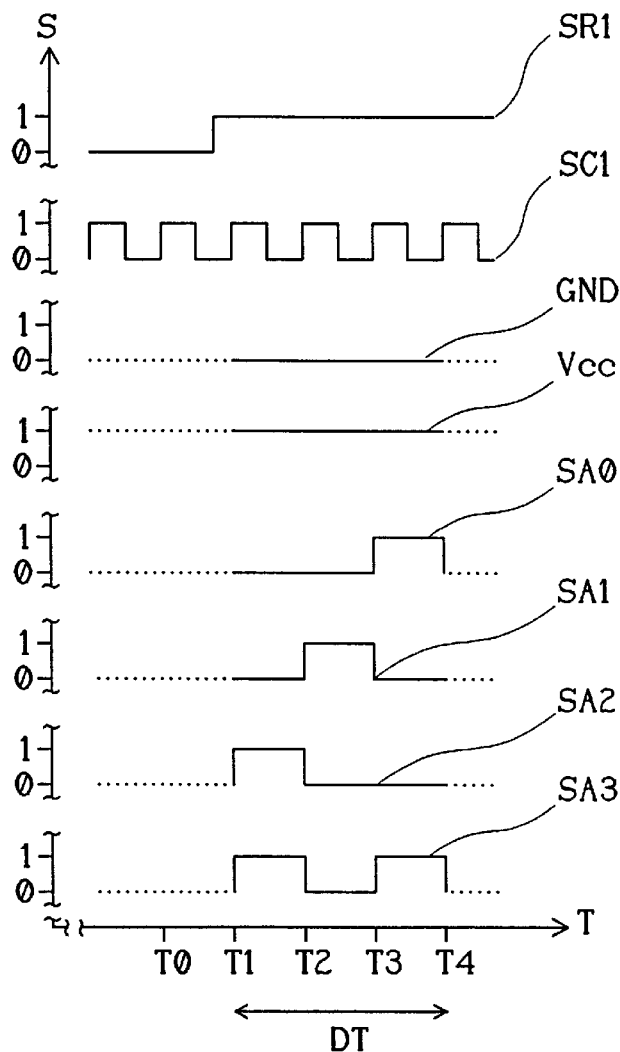
FIG. 2b is a table illustrating different circuit connections.
FIG. 2c is a diagram illustrating signal sequences to and from the circuit connections.

As in the former case, the circuit IC2 can be set to different operating modes. Similar to the earlier described embodiment, these operating modes are combinations of connected memory units ROM, RAM and different frequencies of the clock signal SC1. The table in FIG. 2b illustrates an example with eight different operating modes. Those operating modes that have been numbered from 1 to 4 are the same as in the former case, whereas the operating modes that have been numbered from 5 to 8 are novel to this example. As will be seen from the table in FIG. 2b, it is the control outputs P01, P02 whose values are different to those of the control outputs in the former case, thereby enabling the scaling unit PS to generate the clock signal SC1 with a further two different frequencies f3 and f4.

Similar to the earlier described embodiment, each of these operating modes is corresponded by a unique setting signal sequence SA0–SA3 stored in the first storage unit SU1 in the signal sequence generator PG. This second embodiment also shows how the further operating modes can be represented without increasing the number of signal connections. A signal sequence consisting of the constant signal level "low" can be passed to the signal sequence detector PD2 by making a connection X2 between the setting signal input M2 and signal earth GND. In a corresponding manner, a signal sequence consisting solely of the signal level "high" can be passed from a connection for the supply voltage Vcc of the circuit IC2. These signal sequences consisting of constant signal levels are illustrated in FIG. 2c, together with remaining signal sequences SA0–SA3.

Only eight different operating modes are exemplified in this embodiment. Several operating modes can be represented with two setting signal inputs M1, M2, four signal connections A–A3 and the two constant levels GND, Vcc. Up to thirty-two operating modes can be represented, depending on the combination of connections X1, X2 used between signal connections A0–A3, the signal levels GND, Vcc and the setting signal inputs M1, M2.

When the control signal SR1 is received on the control signal input R, the circuit IC2 is switched to the setting mode and the signal sequence generator PG sends the signal sequences SA0–SA3 on respective address conductors A0–A3. The setting signals SA0–SA3 and the constant signal levels "low" and "high" from signal earth GND and supply voltage Vcc respectively are received in the signal sequence detector PD2. The signal sequence detector PD2 indicates which of the control outputs S01, S02, P01, P02 shall be set to the signal level "low" and which of the control outputs S01, S02, P01, P02 shall be set to the signal level "high" on the basis of which signal sequence has been received on respective setting signal inputs M1, M2.

The second inventive method comprises the following method steps:

A user elects to switch the circuit IC2 to the fifth operating mode.

A connection X1 is made between the setting signal input M1 and the address bus connection A0. The connection may have the form of a strap on the circuit board (not shown in the Figure) on which the circuit IC2 is mounted, between said connections A0, M1.

A connection X2 is made between the setting signal input M2 and the operating voltage connection Vcc. The connection may be a strap on the circuit board (not shown in the Figure) on which the circuit IC2 is mounted, between said connections Vcc, M2.

The circuit IC2 is set to the setting mode, by sending a control signal SR1 to the circuit IC2 via the control signal input R. The control signal SR1 switches level S from a "low" to a "high" level at a time point between T0 and T1 according to FIG. 2c. This change in signal level is detected in the circuit IC2 and the normal mode of the circuit IC2 is interrupted and said circuit switched to the setting mode upon commencement of the clock cycle T1–T2.

The signal sequences SA0–SA3 are sent from the signal sequence generator PG on the address bus connections A0–A3. The signal sequences are sent during the time interval DT, the clock cycles T1–T2, T2–T3 and T3–T4, illustrated in FIG. 2c. Because of the connection X1 made between the address conductor A0 and the setting signal input M1, the setting signal sequence SM1 that arrives at the setting signal input M1 will be the sequence sent from the address conductor A0 as signal sequence SA0. The time duration DT of the setting mode is controlled by a first time monitoring unit TU1 in the signal sequence generator PG. This first time monitoring unit TU1 interrupts transmission of the signal sequences SA0–SA3 from the signal sequence generator PG, when reaching a time deadline stored in the first time monitoring unit TU1, this deadline being expressed in a number of clock cycles of the clock signal SC1.

In the setting mode, the signal sequence detector PD2 receives the signal sequence SM1 sent from the signal sequence generator PG, via the selected address conductor A0 and the connection X1 to the setting signal input M1. Also received is the constant signal level 0 represented by a signal sequence SM2 to the second setting signal input M2. The received signal sequences SM1, SM2 are stored in the second storage unit SU2. These signal sequences SM1, SM2, which are available in the second storage unit SU2 after bringing the circuit to the setting mode, determine the operating mode to which the circuit IC2 shall be set on the basis of the interpretation described below.

Interpretation of the setting signal sequences SM1, SM2 and adaptation of the control outputs P01, P02, S01, S02 to respective signal levels "low" "low" "high" and "high" are carried out in accordance with the table in FIG. 2b. This involves setting the control input SI1 of the read-only memory ROM to the level "high" and results in the read-only memory ROM being connected to the address bus AB and to the data bus DB. The control input SI2 of the read-write memory RAM is also set to the level "high" and also results in connection of the read-write memory RAM to the buses AB, DB. The scaling unit PS receives the signal levels "low" and "low" on the respective signal inputs PI1 and PI2. This results in the scaling unit PS sending the clock signal SC1 with the third frequency f3. Reception of the setting signal sequences SM1, SM2 in the signal sequence detector PD2 is interrupted upon reaching the time deadline stored in a second time monitoring unit TU2, this deadline being expressed in a number of clock cycles of the clock signal SC1. This time deadline has the same duration as the time deadline stored in the first time monitoring unit TU1.

Setting of the operating mode is terminated. Setting of the operating mode is terminated when the setting signals SM1, SM2 have been received in the circuit IC2 through the setting signal inputs M1, M2, subsequent to clock cycle T3–T4. This is effected in response to a command from the time monitoring units TU1 and TU2. The circuit IC2 therewith switches from the setting mode to the fifth operating mode, in which operating mode all units of the circuit IC2 operate in accordance with said operating mode and the address conductors A0–A3 return to forwarding binary addresses.

Figure 2D:
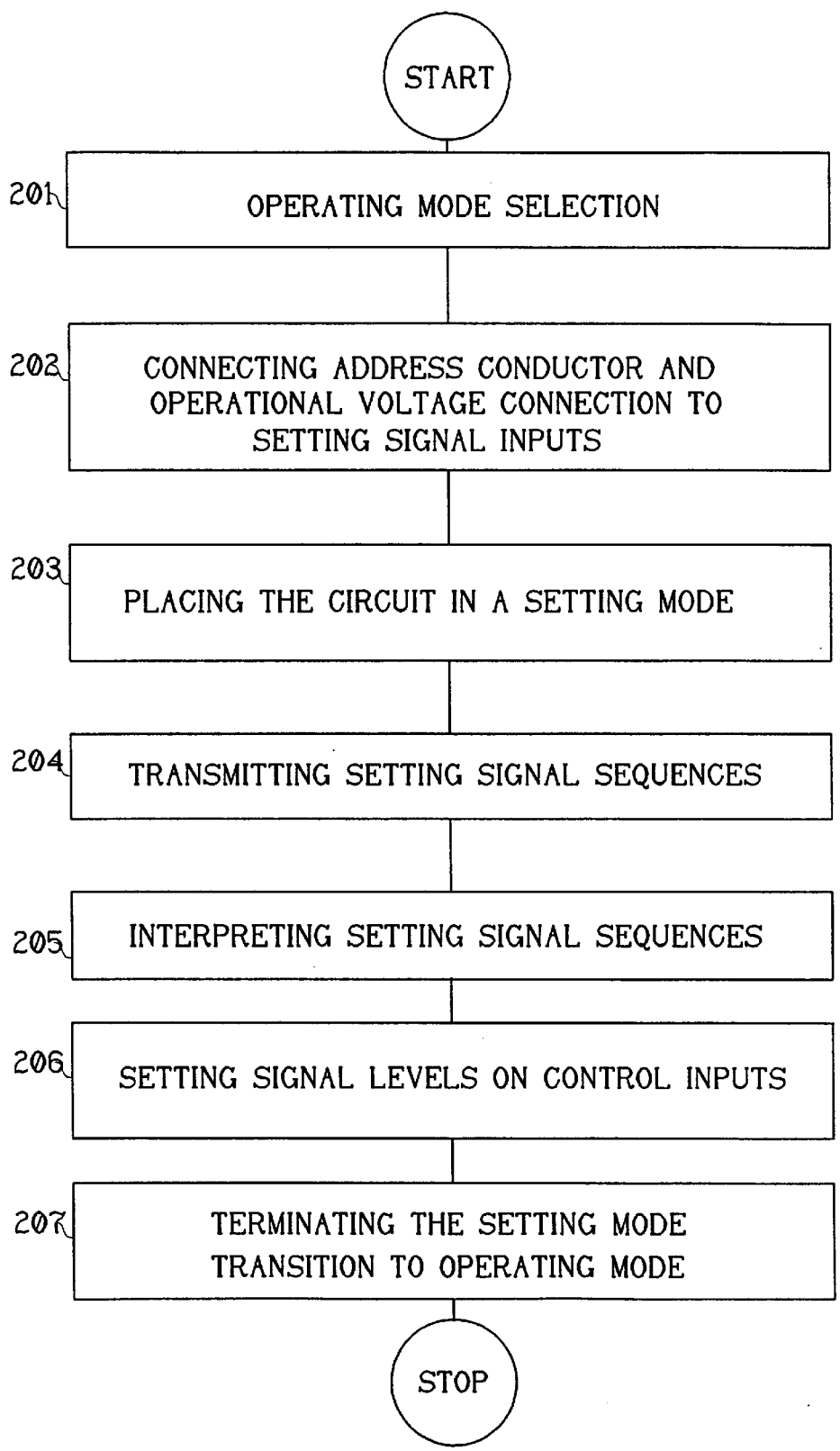
FIG. 2d is a flowchart illustrating an inventive method.

FIG. 2d illustrates the method steps most essential to the invention. The flow diagram is intended to be read together with the following description:

In a first step 201, a user elects to adapt the circuit IC2 to the fifth operating mode.

In a second step 202, the address conductor A0 is connected to the first setting signal input M1 and the second setting signal input M2 is connected to the operational voltage connection Vcc.

In a third step 203, the circuit IC2 is adapted to the setting mode, by sending a control signal SR1 to the control signal input R of the circuit IC2.

In a fourth step 204, the setting signal sequence SA0 is sent from the signal sequence generator PG to the signal sequence detector PD2 via the setting signal input M1. The second setting signal sequence SM2 is the constant signal level 1 and is sent to the second setting signal input M2 from the operational voltage connection Vcc.

In a fifth step 205, the setting signal sequences SM1, SM2 received in the signal sequence detector PD2 are interpreted.

In a sixth step 206, the control outputs S01, S02, P01, P02 of the signal sequence detector PD2 are adapted to the signal levels "low" "low" "high" and "high" respectively, these signal levels therewith also being applied to the control inputs SI1, SI2 of the memory units RAM, ROM and to the control inputs PI1, PI2 of the scaling unit PS.

In a seventh step 207, the method is terminated in response to the circuit IC2 switching to the selected operating mode, in which mode the address conductors A0–A3 are used in accordance with said operating mode.

In the aforegoing, the selected address conductor A0 is connected to the setting signal input M1 and the operational voltage Vcc is applied to the second setting signal input M2 directly through the connections X1, X2. It will be understood, however, that these connections can be made in other ways, for instance with the aid of one or two multipath switches which can be readily caused to bring the various address conductors A0–A3 into contact with the setting signal inputs M1, M2. It will also be understood that one and the same address conductor A0–A3 can be connected to both setting signal inputs M1, M2.

In both of the aforedescribed examples, the address conductors A0–A3 of the address bus AB have been used as signal outputs for the setting signal sequences SA0–SA3. This is done for the precise reason that the address conductors A0–A3 are signal outputs in normal operation. However, it is not absolutely necessary to use connections which are outputs in normal operation of the circuit as outputs. Solutions are also conceivable in which signal inputs (not shown in the Figures) may also be used to function temporarily as signal outputs in the setting mode and therewith transmit the setting signal sequences SA0–SA3. However, it is necessary to take into account the external units connected to these inputs when applying this latter solution. It is necessary to inform the external circuits to stop signalling to the integrated circuit IC2 and to adopt measures which will ensure that the external circuits will not be damaged by the setting signals SA0–SA3.

It will also be understood that a mixture of signal inputs, signal outputs and two-way inputs/outputs which function as signal outputs in the setting mode are also conceivable.

What is claimed is:

1. A method of setting an integrated circuit in one of at least two predetermined separate operating modes, wherein the circuit includes at least two signal connections, a setting signal input which upon receipt of a predetermined signal sequence sets the circuit in the predetermined operating mode indicated by said sequence, wherein the circuit also includes a control signal input which upon receipt of a control signal sets the circuit to a setting mode in which each of the signal connections transmit different predetermined signal sequences, and wherein the method comprises the following steps:

selecting one of the operating modes;

connecting one of the signal connections to the setting signal input, wherein in the setting mode the signal connection sends a signal sequence which, when received on the setting signal input indicates the selected operating mode;

receiving the control signal on the control signal input so that the circuit is set to the setting mode and the signal sequence is received on the setting signal input; and setting the circuit to the operating mode indicated by the signal sequences wherein each of the signal connections functions in accordance with the selected operating mode.

2. A method of setting an integrated circuit in a predetermined one of at least two different operating modes, wherein the circuit includes at least two signal connections, at least two setting signal inputs which upon receipt of at least one predetermined signal sequence sets the circuit to said predetermined operating mode indicated by the sequence, wherein the circuit also includes a control signal input which upon receipt of a control signal sets the circuit to a setting mode in which each of the signal connections transmit different predetermined signal sequences, and wherein the method comprises the following steps:

selecting one of the operating modes;

connecting at least one of the signal connections to at least one of the setting signal inputs, wherein in the setting mode said signal connection transmits a signal sequence which upon receipt on at least one of the setting signal inputs indicates the selected operating mode;

receiving the control signal on the control signal input so as to set the circuit to the setting mode, and the signal sequence is received on at least one of the setting signal inputs; and setting the circuit to the operating mode indicated by the signal sequence, wherein each of the signal connections function in accordance with the selected operating mode.

3. A method according to claim 2, wherein a circuit external signal source is connected to at least one of the setting signal inputs.

4. A method according to claim 1, wherein when in its operating modes the integrated circuit has signal outputs which are used for said signal connections.

5. A method according to claim 1, wherein when in its operating modes the integrated circuit has signal inputs which are used for said signal connections.

6. A method according to claim 1, wherein when in its operating modes the integrated circuit has at least one signal output and at least one signal input, said output and input being used for said signal connections.

7. A method according to claim 1, wherein when in its operating modes the integrated circuit has two-way signal inputs/signal outputs which are used for said signal connections.

8. A method according to claim 1, wherein when in its operating modes the integrated circuit has address conductors on an address bus, said address conductors being used for said signal connections.

9. A method according to claim 1, wherein when in its operating modes the integrated circuit has data conductors on a data bus, said data conductors being used for said signal connections.

10. A method according to claim 1, wherein when in its operating modes the integrated circuit has at least one address conductor on an address bus and at least one data conductor on a data bus, said address conductor and said data conductor being used for said signal connections.

11. An integrated circuit comprising:

at least one signal sequence generator which includes at least two signal connections, wherein the signal sequence generator sends setting signal sequences via the signal connections;

at least one signal sequence detector which includes a setting signal input and at least two control outputs, wherein the signal sequence detector sets each of the control outputs to one of two signal levels in dependence on the received setting signal sequence;

a connection between one of the signal connections and the setting signal input; and at least one time monitoring unit, wherein said time monitoring unit includes means for interrupting the transmission of setting signal sequences by the signal sequence generator.

12. An integrated circuit comprising:

at least one signal sequence generator which includes at least two signal connections, wherein the signal sequence generator sends setting signal sequences via the signal connections;

at least one signal sequence detector which includes at least two setting signal inputs and at least two control outputs, wherein the signal sequence detector sets each of the control units to one of two signal levels in dependence on the received setting signal sequences;

at least two connections, wherein said connections maintain contact between at least one of the signal connections and at least one of the setting signal inputs; and at least one time monitoring unit which includes means for interrupting transmission of the setting signal sequences by said signal sequence generator.

13. An integrated circuit according to claim 12, wherein a circuit external signal source is connected to at least one of the setting signal inputs.

14. An integrated circuit according to claim 11, wherein the signal connections are signal outputs.

15. An integrated circuit according to claim 11, wherein the signal connections are signal inputs.

16. An integrated circuit according to claim 11, wherein the signal connections include at least one signal output and at least one signal input.

17. An integrated circuit according to claim 11, wherein the signal connections include at least one two-way signal output/signal input.

18. An integrated circuit according to claim 11, wherein the circuit includes an address bus, and in that the signal connections comprise part of the address bus.

19. An integrated circuit according to claim 11, wherein the circuit includes a data bus, and in that the signal connections form part of the data bus.

20. An integrated circuit according to claim 11, wherein the circuit includes an address bus and a data bus, and wherein the signal connections include at least one address conductor the address bus and at least one data conductor on the data bus.

* * * * *